(12) United States Patent
Niel

(10) Patent No.: US 7,767,532 B2
(45) Date of Patent: Aug. 3, 2010

(54) METHOD FOR MANUFACTURING AN EEPROM CELL

(75) Inventor: Stephan Niel, Greasque (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 12/354,854

(22) Filed: Jan. 16, 2009

(65) Prior Publication Data

US 2009/0186460 A1   Jul. 23, 2009

(30) Foreign Application Priority Data

Jan. 21, 2008   (FR) .................................. 08 50350

(51) Int. Cl.
*H01L 21/336* (2006.01)
*H01L 29/80* (2006.01)

(52) U.S. Cl. ........................ 438/283; 438/301; 257/270; 257/E21.421; 257/E21.623

(58) Field of Classification Search ................ 438/157, 438/283, 279, 285, 301, 231, 232; 257/270, 257/E21.421, E21.623
See application file for complete search history.

(56) References Cited

U.S. PATENT DOCUMENTS 6,797,553 B2 * 9/2004 Adkisson et al. ............ 438/202

2007/0018230 A1   1/2007 Park et al.

FOREIGN PATENT DOCUMENTS

| JP | 58 121680 A | 7/1983 |
| JP | 61 050369 A | 3/1986 |
| JP | 01 259567 A | 10/1989 |
| JP | 2001 148430 A | 5/2001 |

OTHER PUBLICATIONS

French Search Report dated Sep. 12, 2008 from corresponding French Application No. 0850350.

* cited by examiner

*Primary Examiner*—Hsien-ming Lee
(74) *Attorney, Agent, or Firm*—Lisa K. Jorgenson; James H. Morris; Wolf, Greenfield & Sacks, P.C.

(57) ABSTRACT

A method for manufacturing an EEPROM cell including a dual-gate MOS transistor. The method includes the steps of providing a semiconductor substrate covered with a stack of first and second layers, forming at least one first opening in the second layer, forming, in the first layer, a second opening continuing the first opening, enlarging the first opening by isotropic etching, forming a first doped region in the substrate by implantation through the first enlarged opening, the first doped region taking part in the forming of the transistor drain or source, forming, in the third opening, a thinned-down insulating portion thinner than the first layer, and forming the gates of the MOS transistor at least partially extending over the thinned-down insulating portion.

23 Claims, 4 Drawing Sheets

METHOD FOR MANUFACTURING AN EEPROM CELL

CROSS REFERENCE TO RELATED APPLICATIONS

This application claims the priority benefit of French patent application number 08/50350, filed on Jan. 21, 2008 entitled "METHOD FOR MANUFACTURING AN EEPROM CEL," which is hereby incorporated by reference to the maximum extent allowable by law.

BACKGROUND OF THE INVENTION

1. Field of the Invention

The present invention relates to methods for manufacturing electrically erasable and programmable non-volatile memory cells or EEPROM cells and to memory cells obtained with such methods.

2. Discussion of the Related Art

An EEPROM cell generally comprises a selection element and a storage element. As an example, the selection element corresponds to a MOS transistor and the storage element corresponds to a dual-gate MOS transistor comprising a floating gate covered with a control gate. The floating gate insulator comprises a thinned-down portion at the level of the dual-gate transistor drain which forms a tunnel window.

The operation of such a memory cell is the following. An erasing operation in the memory cell is performed by turning on the selection transistor, by setting the drain and the source of the dual-gate transistor to 0 volt, and by setting the control gate of the dual-gate transistor to a given voltage. This causes the passing of charges from the drain to the floating gate of the dual-gate transistor through the tunnel window and the storage of charges in the floating gate. A write operation in the memory is performed by turning on the selection transistor, by applying a write voltage between the drain and the source of the dual-gate transistor and by maintaining the control gate of the dual-gate transistor at 0 volt. This causes the evacuation of the charges stored in the floating gate through the tunnel window. A read operation is performed by turning on the selection transistor, by applying a read voltage, smaller than the write voltage, between the drain and the source of the dual-gate transistor, and by setting the control gate of the dual-gate transistor to a given voltage. The magnitude of the current conducted by the dual-gate transistor is representative of the presence or of the absence of charges in the floating gate.

Conventional methods for manufacturing such a memory cell generally comprise several photolithographic etch steps requiring use of masks. As an example, a first mask is used to delimit the source and drain regions of the dual-gate transistor and a second mask is used to delimit the tunnel window.

A critical point on manufacturing of the dual-gate transistor is the positioning of the drain region with respect to the tunnel window, that is, the positioning of the first mask relative to the second mask. Indeed, to ensure a proper operation of the dual-gate transistor, it is necessary for the drain region to extend under the entire tunnel window and to extend slightly beyond the tunnel window. It is desirable for this extension or projection of the drain region out of the tunnel window to be as small as possible to enable decreasing the memory cell dimensions. However, given the accuracy of currently-used mask positioning methods, it is generally necessary to provide a minimum projection greater than 0.1 μm. It is further desirable for the projection to be substantially the same from one memory cell to the other to ensure a homogeneity of the operating properties of memory cells. Memory cells being generally formed in pairs of adjacent cells symmetrical with respect to the common edge between cells, a misalignment between the first and second masks translates as projections which are different between the two asymmetrical cells. The operating properties of the memory cells of a same memory may then not be identical (odd/even effect).

SUMMARY OF THE INVENTION

An aspect of the present invention aims at a method for manufacturing an EEPROM cell which ensures an accurate positioning between the drain region and the tunnel window of the dual-gate transistor of the memory cell.

According to another aspect, the method for manufacturing the memory cell requires using one less mask than a conventional manufacturing method.

Another aspect of the present invention aims at a memory cell with a structure which enables recognizing that it has been formed according to a specific embodiment of the method of the present invention.

Thus, an embodiment of the present invention provides a method for manufacturing a cell of a non-volatile electrically erasable and programmable memory comprising a dual-gate MOS transistor. The method comprises the steps of:

(a) providing a semiconductor substrate covered with a stack of first and second layers, the first layer being insulating;

(b) forming at least one first opening in the second layer;

(c) forming, in the first layer, a second opening continuing the first opening;

(d) enlarging the first opening by isotropic etching;

(e) forming a first doped region in the substrate by implantation through the first enlarged opening, the first doped region taking part in the forming of the transistor drain or source;

(f) forming, in the third opening, a thinned-down insulating portion thinner than the first layer; and (g) forming the gates of the MOS transistor at least partially extending over the thinned-down insulating portion.

According to an embodiment, at step (b), a third opening is formed in the second layer. At step (c), a fourth opening extending the third opening is formed in the first layer. At step (d), the third opening is enlarged by said isotropic etching. At step (e), a second additional doped region is formed in the substrate by implantation through the third enlarged opening. At step (f), an additional thinned-down insulating portion thinner than the first layer is formed in the fourth opening, the gates of the MOS transistor extending between the thinned-down insulating portion and the additional thinned-down insulating portion and at least partially over the additional thinned-down insulating portion, the second additional doped region taking part in the forming of the transistor drain or source.

According to an embodiment, the first region extends beyond the thinned-down insulation portion by at least 60 nm.

According to an embodiment, step (e) is followed by an activation anneal step.

According to an embodiment, step (f) is preceded by a step of elimination of the second layer.

According to an embodiment, step (d) is performed by etching under an oxygen plasma.

According to an embodiment, the first layer has a thickness smaller than 20 nm and the thinned-down insulating portion has a thickness smaller than 7 nm.

Another embodiment of the present invention also provides a cell of a non-volatile electrically erasable and programmable memory formed according to the previously-described method at the level of a semiconductor substrate. The cell comprises a dual-gate MOS transistor in which a gate is separated from the substrate by an insulating layer, the insulating layer comprising two thinned-down insulating portions, the gate extending between and on at least a portion of the thinned-down insulating portions, and in which a drain and a source each comprise a doped region formed in the substrate and extending under all of one of the thinned-down insulating portions.

BRIEF DESCRIPTION OF THE DRAWINGS

The foregoing objects, features, and advantages of the present invention will be discussed in detail in the following non-limiting description of specific embodiments in connection with the accompanying drawings.

DETAILED DESCRIPTION

Figure 1A:
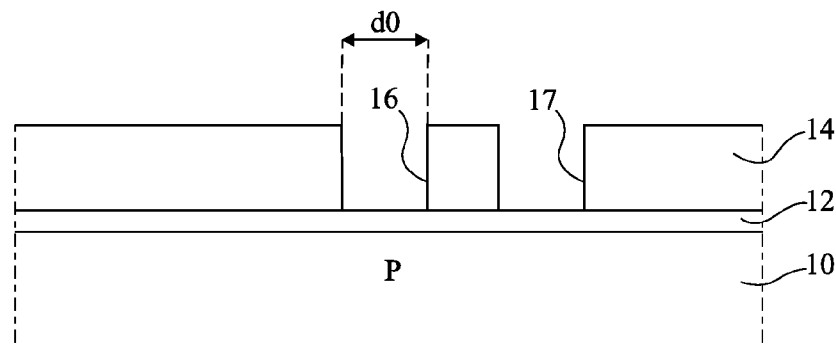
FIGS. 1A to 1I show the structures obtained at successive steps of a conventional example of an EEPROM cell forming method.

For clarity, the same elements have been designated with the same reference numerals in the different drawings and, further, as usual in the representation of integrated circuits, the various drawings are not to scale.

FIGS. 1A to 1I are cross-section views of an EEPROM cell at successive steps of a conventional manufacturing method.

FIG. 1A shows the structure obtained after the steps of:

forming on a semiconductor substrate 10, for example, a P-type doped single-crystal silicon substrate, of an insulating layer 12;

deposition of a masking film 14 on insulating layer 12; and forming of openings 16, 17 in film 14, by a photolithographic etch method using a first mask (not shown) to insolate film 14. Openings 16, 17 are respectively formed above the portions of substrate 10 where drain and sources regions of the dual-gate transistor are desired to be formed. The dimension of opening 16 along the direction perpendicular in the cross-section plane to the stack direction of layers 12 and 14 is called width d0.

Figure 1B:
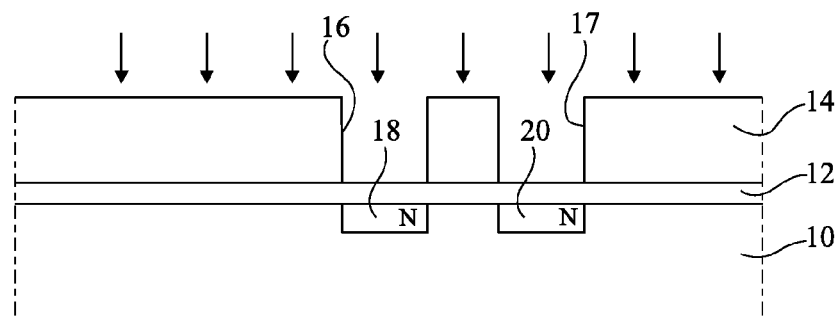

FIG. 1B shows the structure obtained after having carried out an implantation step resulting in the forming of doped regions 18, 20, for example, of type N, in substrate 10 in continuation of openings 16, 17.

Figure 1C:
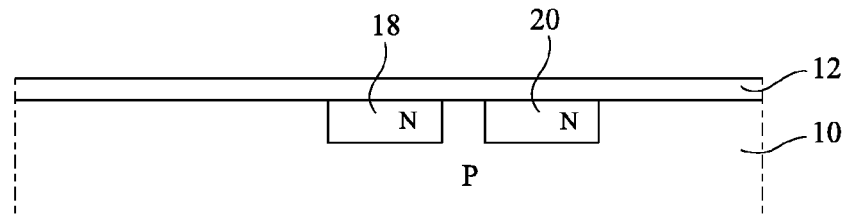

FIG. 1C shows the structure obtained after having removed film 14 and after having carried out an activation anneal. The anneal causes a diffusion of dopant elements from regions 18 and 20, whereby an expansion of regions 18 and 20 occurs.

Figure 1D:
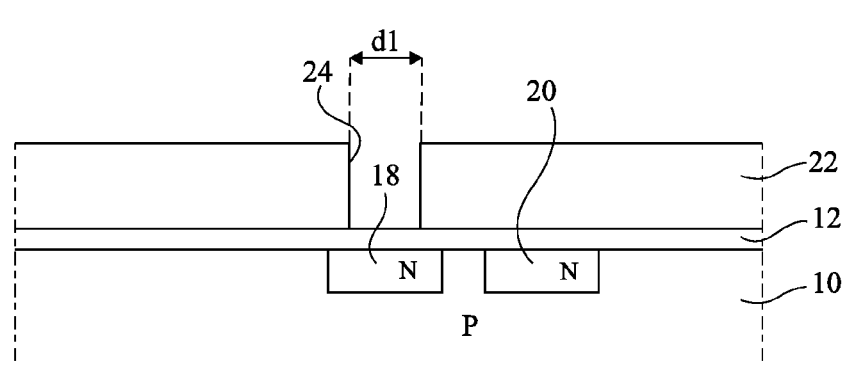

FIG. 1D shows the structure obtained after having deposited a masking film 22 on insulating layer 12 and after having formed an opening 24 in film 22 above the portion of insulating layer 12 where the tunnel window of the dual-gate transistor is desired to be formed. The etching of film 22 is carried out by a photolithographic etch method using a second mask (not shown) to insolate film 22. The width of opening 24 is called d1.

Figure 1E:
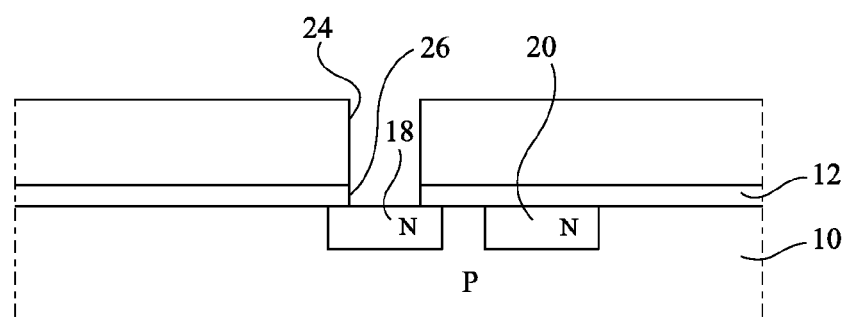

FIG. 1E shows the structure obtained after having etched insulating layer 12 to form an opening 26 in continuation of opening 24.

Figure 1F:
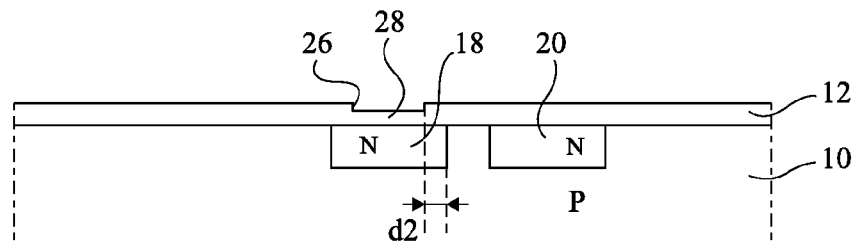

FIG. 1F shows the structure obtained after having removed film 22 and after having formed a thinned-down insulating portion 28, at the level of opening 26, thinned-down insulating portion 28 forming the tunnel window of the dual-gate transistor. Region 18 extends under the entire tunnel window 28. The projection or extension of region 18 beyond tunnel window 28 on the side where the gates of the dual-gate transistor must be formed is called d2.

Figure 1G:
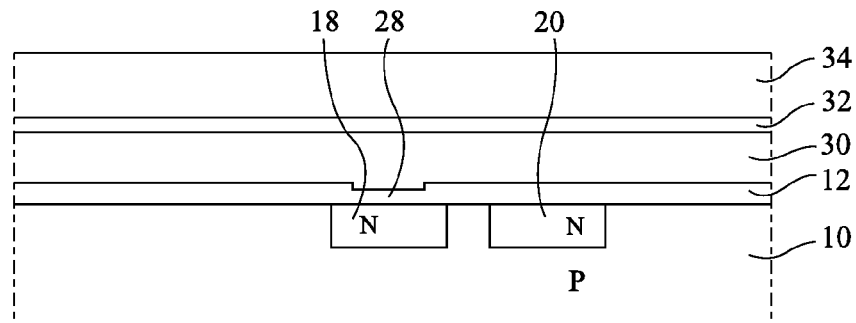

FIG. 1G shows the structure obtained after having deposited on layer 12 a first polysilicon layer 30, an insulating layer 32, and a second polysilicon layer 34.

Figure 1H:
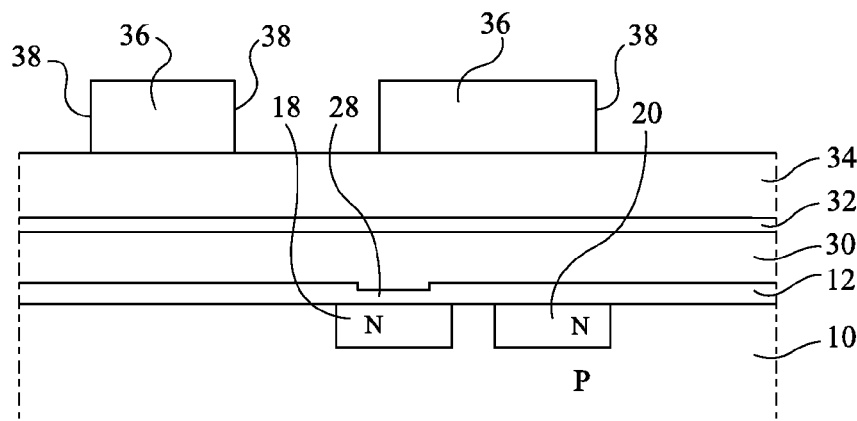

FIG. 1H shows the structure obtained after having deposited a masking film 36 on insulating layer 34 and after having etched openings 38 in film 36 which follow the contours of the selection transistor and of the dual-gate transistor of the EEPROM cell. The etching of film 36 is performed by a photolithography method using a third mask (not shown) to insolate film 36.

Figure 1I:
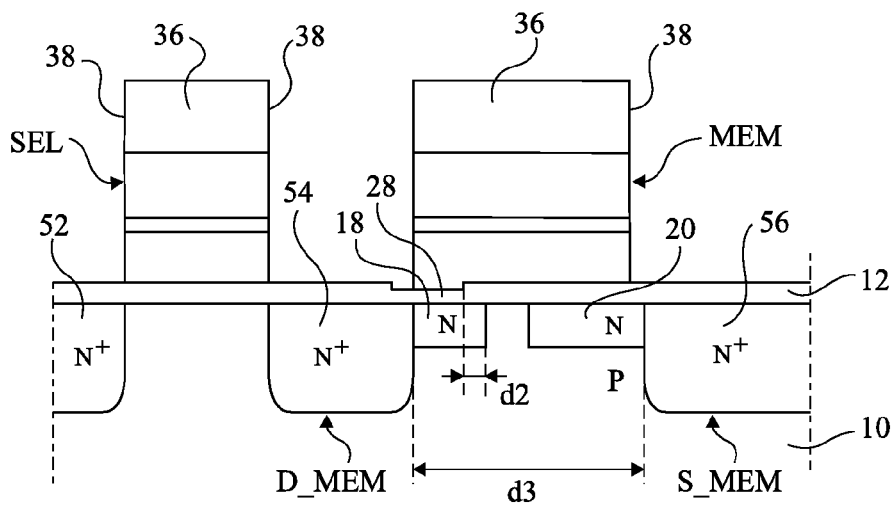

FIG. 1I shows the structure obtained after having anisotropically etched the stack of layers 30, 32, 34 in continuation of openings 38 of film 36 and after having carried out an implantation step. The etch step enables delimiting, for each memory cell, dual-gate transistor MEM and selection transistor SEL. The implantation step causes the forming in substrate 10 of heavily-doped N-type regions 52, 54, 56 in continuation of openings 38. Region 54 forms, with region 18, drain region D_MEM of dual-gate transistor MEM. Further, region 54 forms the source of selection transistor SEL. Region 52 forms the drain of transistor SEL. Region 56 forms, with region 20, source S_MEM of transistor MEM. The gate width of transistor MEM is called d3.

To ensure a proper operation of the memory cell, it is necessary for region 18 to extend under the entire tunnel window 28 and to extend beyond tunnel window 28 on the side of gate portion 40, that is, projection d2 must be strictly positive. According to the previously-described manufacturing method, projection d2 is defined by two masks, the first mask being used to delimit region 18 (before the anneal step) and the second mask being used to delimit opening 26 in which tunnel window 28 is formed. It is thus necessary to accurately control the positioning of the first mask with respect to the second mask so that projection d2 has the desired value.

For a dual-gate transistor MEM for which width d3 varies, for example, from 500 nm to 1000 nm, given the accuracy of conventional mask-positioning methods, it is necessary for projection d2 to be on the order of 100 nm.

FIGS. 2A to 2I are cross-section views of an EEPROM cell at successive steps of an example of a manufacturing method according to the present invention.

Figure 2A:
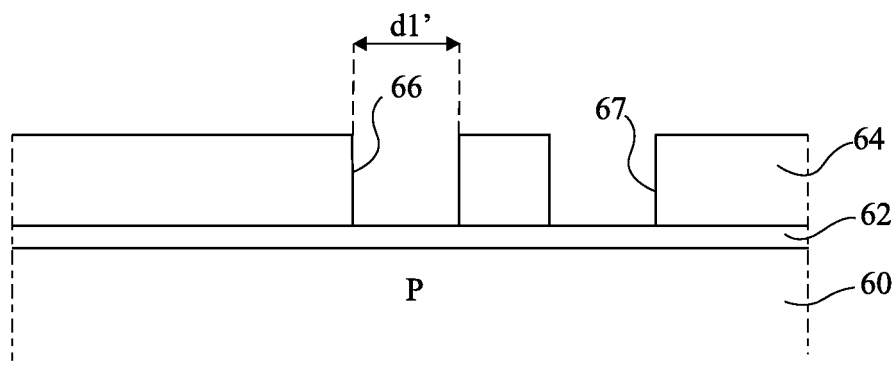
FIGS. 2A to 2I show the structures obtained at successive steps of an example of a method for manufacturing an EEPROM cell according to the present invention.

FIG. 2A is similar to FIG. 1A and shows the structure obtained after the steps of:

forming on a semiconductor substrate 60, for example, a P-type doped single-crystal silicon substrate, an insulating layer 62, for example, a silicon oxide layer having a thickness on the order of 20 nm;

depositing a masking film 64, for example a resist, on insulating layer 62; and forming openings 66, 67 in film 64 by a photolithographic etch method using a first mask (not shown) to insolate film 64. The width of opening 66 is called d1'.

Opening 66 is formed above the portion of substrate 60 in which the drain region of the dual-gate transistor is desired to be formed, but width d1' is smaller than the width of the desired drain region (before the activation anneal). Indeed, width d1' corresponds to the desired width of the tunnel window of the dual-gate transistor. Opening 67 is formed at the level of the portion of substrate 60 in which the source region of the dual-gate transistor is desired to be formed.

Figure 2B:
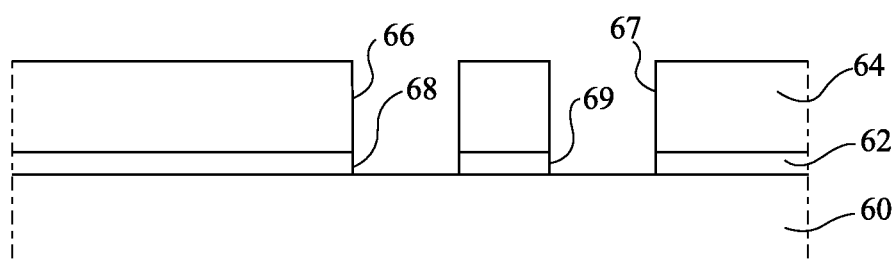

FIG. 2B shows the structure obtained after having anisotropically etched insulating layer 62 to form openings 68, 69 in continuation of openings 66, 67. An etching by a hydrofluoric bath may be used.

Figure 2C:
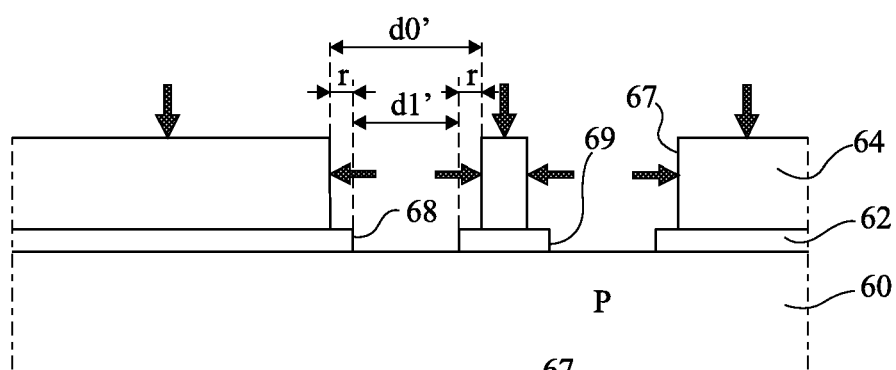

FIG. 2C shows the structure obtained after having performed a partial isotropic etching of film 64. This etching is, for example, an isotropic etching under an oxygen plasma which causes an etching of film 64 on all its surfaces. The etch parameters are defined so that width d0' of opening 66 after etching is increased with respect to width d1' by twice a distance r selected according to the desired subsequent projection.

Figure 2D:
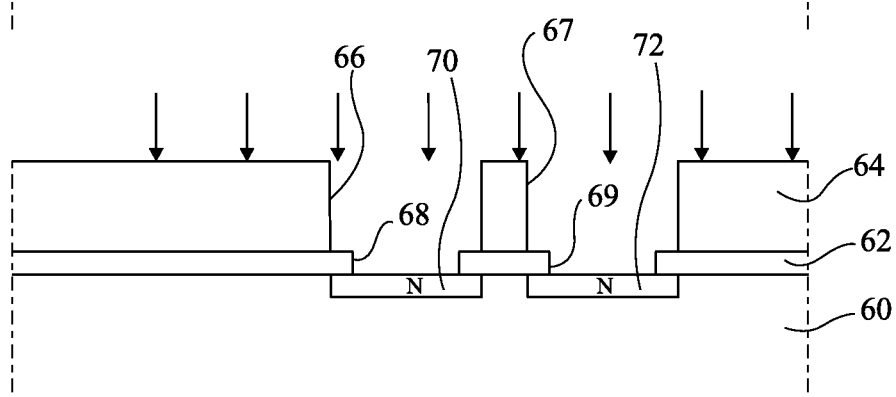

FIG. 2D shows the structure obtained after having carried out an implantation step causing the forming of doped regions 70, 72, for example, of type N, in substrate 60 in continuation of openings 66, 67. The width of region 70, which substantially corresponds to width d0' of the corresponding opening 66, is thus greater than width d1' of opening 68.

Figure 2E:
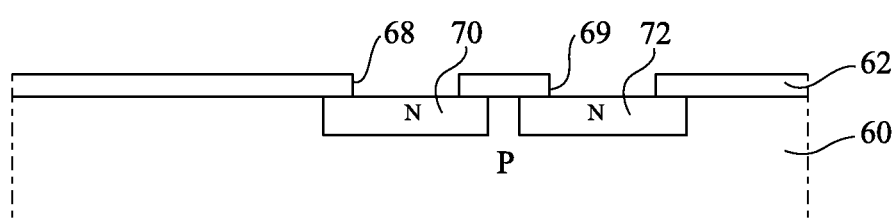

FIG. 2E shows the structure obtained after having removed film 64 and after having carried out an activation anneal. The anneal results in a diffusion of dopant elements from regions 70, 72, which results in an expansion of regions 70, 72.

Figure 2F:
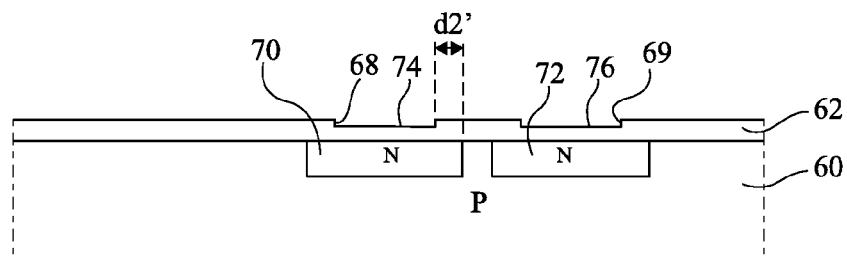

FIG. 2F shows the structure obtained after having formed thinned-down insulating portions 74, 76 in openings 68, 69, for example silicon oxide portions, having a thickness on the order of 7 nm. Portions 74, 76 may be formed by a thermal oxidation method which tends to cause the forming of oxide on substrate 60 in openings 68, 69 but also, to a smaller degree, on insulating layer 62. Thinned-down insulating portion 74 forms the tunnel window of the dual-gate transistor. Region 70 extends under the entire tunnel window 74. The projection or extension of region 70 with respect to tunnel window 74 on the side where the gates of the dual-gate transistor must be formed is called d2'. Similarly, region 72 extends under thinned-down insulating portion 76 and beyond on the side where the dual-gate transistor gates must be formed.

Figure 2G:
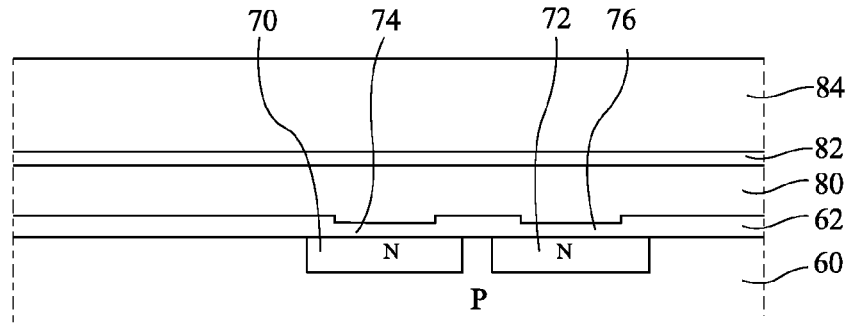

FIG. 2G shows the structure obtained after having deposited, on layer 62, a first polysilicon layer 80, for example having a thickness of approximately 100 nm, an insulating layer 82, for example corresponding to a silicon oxide layer having a thickness of approximately 16 nm, and a second polysilicon layer 84, for example having a thickness of approximately 200 nm.

Figure 2H:
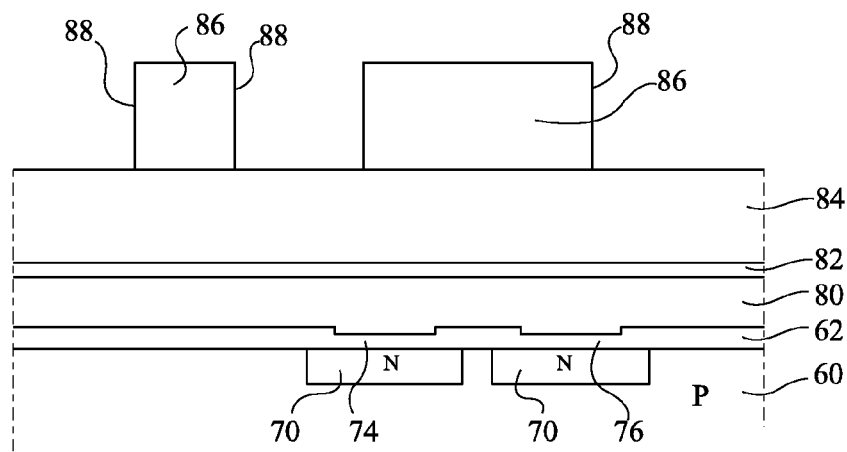

FIG. 2H shows the structure obtained after having deposited a masking film 86, for example a resist, on layer 84 and after having etched openings 88 in film 86 which follow the contours of the selection transistor and of the dual-gate transistor. The etching of film 86 is performed by a photolithographic etch method using a second mask (not shown) to insolate film 86.

Figure 2I:
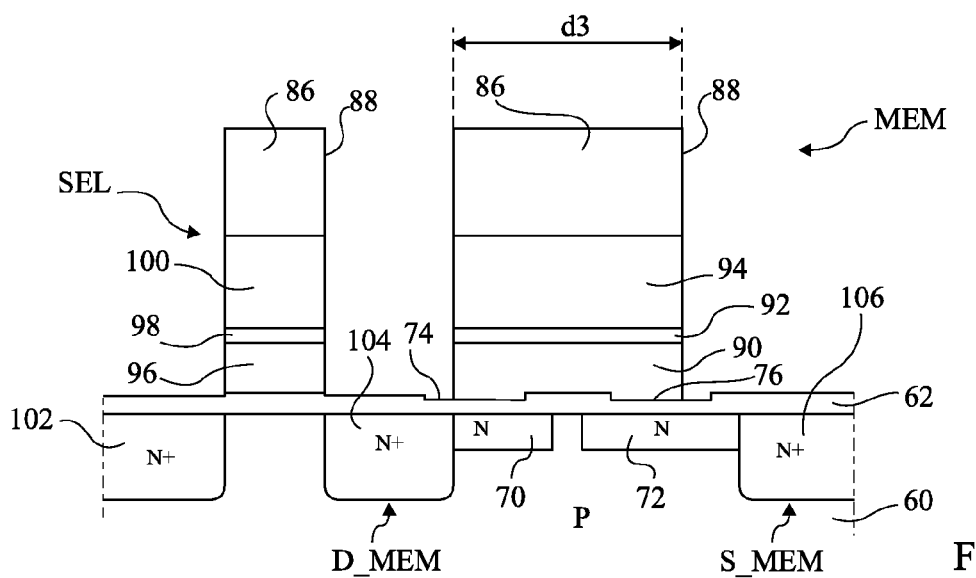

FIG. 2I shows the structure obtained after having anisotropically etched the stack of layers 80, 82, 84 in continuation of openings 88 of film 86, and after having performed an implantation step. The etch step enables delimiting, for each memory cell, dual-gate transistor MEM and selection transistor SEL. Dual-gate transistor MEM comprises a portion 90 of polysilicon layer 80 which forms the floating gate, a portion 92 of insulating layer 82 which forms the control gate insulator, and a portion 94 of polysilicon layer 84 which forms the control gate. Selection transistor SEL comprises a portion 96 of layer 80, a portion 98 of layer 82, and a portion 100 of layer 84. It may be desirable for the operation of transistor SEL to be similar to that of a conventional single-gate MOS transistor. For this purpose, an opening may be provided in insulating portion 98 so that portions 96 and 100 are short-circuited. The implantation step causes the forming in substrate 60 of heavily-doped N-type regions 102, 104, 106 in continuation of openings 88. Region 104 forms, with region 70, drain region D_MEM of dual-gate transistor MEM. Further, region 104 forms the source of selection transistor SEL. Region 102 forms the drain of transistor SEL. Region 106 forms with region 72 source S_MEM of transistor MEM.

As appears in FIG. 2E, projection d2' between region 70 and tunnel window 74 is defined by the dimensions of opening 66 provided in film 64 before and after the isotropic etching performed at the step illustrated in FIG. 2C. Given that only the anisotropic etching implemented to initially form opening 66 requires use of a mask, projection d2' is thus defined by a single mask.

As compared with the method previously described in relation with FIGS. 1A to 1I, the present embodiment thus enables avoiding the use of a mask. This enables decreasing the memory cell manufacturing cost.

Further, the defining of projection d2' does not depend on the relative position of the two masks. Thereby, projection d2' may be obtained with greater accuracy. Projection d2' can thus be decreased with respect to what can be envisaged for a conventional manufacturing method. As an example, for a dual-gate transistor having its width varying from 500 nm to 1000 nm, projection d2' may be smaller than 100 nm, preferably smaller than 60 nm, for example, on the order of 50 nm. Further, projection d2' is constant for all memory cells, since they are arranged in symmetrical pairs.

The present manufacturing process example results in the forming of a thinned-down insulating portion 76 on the source side of dual-gate transistor MEM. An easily-identifiable structural characteristic enabling ensuring that the previously-described method example, which enables more accurately defining projection d2', has been implemented, is thus available in this case. Due to the applied voltages, thinned-down insulating portion 76 does not take part in the operation of dual-gate transistor MEM, with the charge only occurring through tunnel window 74.

Specific embodiments of the present invention have been described. Various alterations, modifications, and improvements will occur to those skilled in the art. In particular, the present invention has been described for a memory cell comprising a dual-gate transistor and a selection transistor. However, the present invention may apply to other memory cell structures, for example, memory cells for which the selection transistors are arranged in common between several memory cells. Further, in the previously-described embodiment, the MOS selection transistor is formed concurrently to the dual-gate MOS transistor and itself comprises a possibly short-circuited dual-gate structure. It should, however, be clear that the selection MOS transistor may comprise a single gate. Further, although the previously-described examples relate to N-channel transistors, it should be clear that the present invention also applies to P-channel transistors, where the voltages applied to the transistors should be modified accordingly.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a cell of a non-volatile electrically erasable and programmable memory including a dual-gate MOS transistor, the method comprising the steps of:
   (a) providing a semiconductor substrate covered with a stack of first and second layers, the first layer being insulating;
   (b) forming at least one first opening in the second layer;
   (c) forming, in the first layer, a second opening continuing the first opening;
   (d) enlarging the first opening by isotropic etching;
   (e) forming a first doped region in the substrate by implantation through the first enlarged opening, the first doped region taking part in the forming of the transistor drain or source;
   (f) forming, in the second opening, a thinned-down insulating portion thinner than the first layer; and
   (g) forming a gate of the MOS transistor at least partially extending over the thinned-down insulating portion.

2. The method of claim 1, wherein:
   at step (b), a third opening is formed in the second layer;
   at step (c), a fourth opening continuing the third opening is formed in the first layer;
   at step (d), the third opening is enlarged by said isotropic etching;
   at step (e), a second additional doped region is formed in the substrate by implantation through the third enlarged opening;
   at step (f), an additional thinned-down insulating portion thinner than the first layer is formed in the fourth opening, the gate of the MOS transistor extending between the thinned-down insulating portion and the additional thinned-down insulating portion and at least partially over the additional thinned-down insulating portion, the second additional doped region taking part in the forming of the transistor drain or source.

3. The method of claim 1, wherein the first doped region extends beyond the thinned-down insulation portion by at least 60 nm.

4. The method of claim 1, wherein step (e) is followed by an activation anneal step.

5. The method of claim 1, wherein step (f) is preceded by a step of elimination of the second layer.

6. The method of claim 1, wherein step (d) is performed by etching under an oxygen plasma.

7. The method of claim 1, wherein the first layer has a thickness smaller than 20 nm and wherein the thinned-down insulating portion has a thickness smaller than 7 nm.

8. A cell of a non-volatile electrically erasable and programmable memory formed according to the method of claim 2 at the level of a semiconductor substrate, the cell comprising a dual-gate MOS transistor, wherein:
   a gate is separated from the substrate by an insulating layer, the insulating layer comprising two thinned-down insulating portions, the gate extending between and over at least a portion of the two thinned-down insulating portions; and
   a drain and a source each comprising a doped region formed in the substrate and extending under at least a portion of one of the two thinned-down insulating portions.

9. A method of forming, at least partially, a memory cell, the method comprising:
   providing a substrate covered with first and second layers;
   forming a first opening in the second layer;
   enlarging the first opening by isotropic etching by an amount resulting in an opening width that corresponds to a width of an expanded doped region;
   forming a doped region in the substrate in the area of the first opening enlarged by the isotropic etching; and
   performing an activation anneal to expand the doped region to the width of the expanded doped region.

10. The method of claim 9, further comprising forming a second opening in the first layer with a width corresponding to a width of a tunnel window of a subsequently formed drain region.

11. The method of claim 9, wherein forming the first opening comprises forming the first opening by utilizing a first mask.

12. The method of claim 11, further comprising forming a second opening in the first layer by performing an anisotropic etch of the first layer without utilizing a second mask.

13. The method of claim 9, wherein performing an activation anneal to expand the doped region comprises performing an activation anneal to expand the doped region beyond a width of the first opening by a distance of less than 100 nm.

14. The method of claim 9, wherein performing an activation anneal to expand the doped region comprises performing an activation anneal to expand the doped region beyond a width of first the opening by a distance of less than 60 nm.

15. The method of claim 9, wherein performing an activation anneal to expand the doped region comprises performing an activation anneal to expand the doped region beyond a width of the first opening by a distance of less than 50 nm.

16. A method of forming a non-volatile programmable memory including a dual-gate MOS transistor, comprising:
   providing a substrate covered with first and second layers;
   forming a first doped region by implantation through a first opening in the second layer, wherein forming the first opening comprises forming the first opening by utilizing a first mask;
   forming, in a second opening in the first layer, a thinned-down insulating portion thinner than the first layer, wherein forming the second opening comprises performing an anisotropic etch of the first layer without utilizing a second mask; and
   forming a gate for the MOS transistor at least partially extending over the thinned-down insulating portion.

17. The method of claim 16, further comprising enlarging the first opening by isotropic etching by an amount resulting in an opening width that corresponds to a width of an expanded doped region.

18. The method of claim 17, further comprising performing an activation anneal to expand the doped region to the width of the expanded doped region.

19. The method of claim 18, wherein performing an activation anneal to expand the doped region comprises performing an activation anneal to expand the doped region beyond a width of the first opening by a distance of less than 60 nm.

20. The method of claim 18, wherein performing an activation anneal to expand the doped region comprises performing an activation anneal to expand the doped region beyond a width of the first opening by a distance of less than 50 nm.

21. The method of claim 16, further comprising forming the second opening with a width corresponding to a desired width of a tunnel window of a subsequently formed drain region.

22. The method of claim 18, wherein performing an activation anneal to expand the doped region comprises performing an activation anneal to expand the doped region beyond a width of the first opening by a distance of less than 100 nm.

23. A method for manufacturing a cell of an electrically erasable and programmable memory, the method comprising:
   (a) providing a semiconductor substrate covered with first and second layers, the first layer being insulating;
   (b) forming a first opening in the second layer;
   (c) forming a second opening in the first layer, the second opening continuing the first opening;
   (d) enlarging the first opening by isotropic etching;
   (e) forming a first doped region in the substrate through the first enlarged opening to form a drain or source of a transistor;
   (f) forming, in the second opening, a thinned-down insulating portion thinner than the first layer; and
   (g) forming a gate of the transistor at least partially extending over the thinned-down insulating portion.

* * * * *